United States Patent [19]

Ooe et al.

[11] Patent Number: 4,851,871
[45] Date of Patent: Jul. 25, 1989

[54] DRIVING UNIT USING ELECTROSTRICTIVE ELEMENT

[75] Inventors: Haruki Ooe; Kouichi Kobayashi, both of Tokyo, Japan

[73] Assignee: Copal Company Limited, Tokyo, Japan

[21] Appl. No.: 161,391

[22] Filed: Feb. 22, 1988

Related U.S. Application Data

[63] Continuation of Ser. No. 25,810, Mar. 13, 1987, abandoned.

[30] Foreign Application Priority Data

Mar. 17, 1986 [JP] Japan ................................. 61-58773
Mar. 26, 1986 [JP] Japan ............................. 61-44128[U]

[51] Int. Cl.⁴ ......................... G03B 7/00; H01L 41/08
[52] U.S. Cl. ..................................... 354/435; 310/317; 310/330
[58] Field of Search ................................ 354/435–440, 354/453, 457, 483; 310/316–318, 328, 330–332

[56] References Cited

U.S. PATENT DOCUMENTS

| | | | |
|---|---|---|---|
| 3,426,661 | 2/1969 | Wick et al. | 354/440 X |
| 3,709,134 | 1/1973 | Kitai | 354/258.1 X |
| 3,801,822 | 4/1974 | Numata | 354/483 X |
| 4,174,893 | 11/1979 | Burgarella et al. | 354/436 |
| 4,263,527 | 4/1981 | Comstock | 310/316 |
| 4,534,638 | 8/1985 | Hirohata et al. | 354/440 X |
| 4,609,275 | 9/1986 | Ishiguro | 354/435 |
| 4,663,555 | 5/1987 | Yoshihiro | 310/317 |

Primary Examiner—W. B. Perkey
Attorney, Agent, or Firm—Wenderoth, Lind & Ponack

[57] ABSTRACT

A driving unit using an electrostrictive element drives mechanical members such as, for example, a diaphragm and a shutter or a shutter blade having the function of a diaphragm blade by deformation of the electrostrictive element produced when a voltage is applied to the element, and is adapted to obtain a desired deformation quantity from the electrostrictive element regardless of the magnitude of an initial deformation quantity due to hysteresis of the element. A reference switch such as, for example, a photointerrupter operates when a predetermined reference deformation quantity is obtained in an area where the deformation quantity changes linearly in respect to variation of an applied voltage. A voltage obtained by superposing a voltage corresponding to a difference between a desired deformation quantity of the element and the reference deformation quantity on a voltage applied to the electrostrictive element when the reference switch is operated is applied to the electrostrictive element so that a desired deformation quantity is obtained regardless of the magnitude of the initial deformation quantity.

16 Claims, 6 Drawing Sheets

DRIVING UNIT USING ELECTROSTRICTIVE ELEMENT

This application is a continuation of now abandoned application Ser. No. 025,810, filed Mar. 13, 1987, now abandoned.

BACKGROUND OF THE INVENTION

The present invention relates to a driving unit using an electrostrictive element, and more particularly to a driving unit which drives mechanical members such as a diaphragm and a shutter or a shutter blade having the function of a diaphragm blade by deformation of the electrostrictive element produced when a voltage is applied to the element, and still more particularly to a novel driving unit using an electrostrictive element which is adapted to obtain a desired deformation quantity without influence of the magnitude of an initial deformation quantity due to hysteresis of the element.

It is well known that when a voltage is applied to, for example, a piezoelectric ceramic having a fixed end through electrodes laminated thereon a free end of the ceramic is deformed in accordance with the voltage applied thereto. Recently, a driving unit employing a characteristic of such an electrostrictive element is known in which deformation of the element produced when a voltage is applied thereto is used as a mechanical driving source to drive, for example, a shutter and a diaphragm or a shutter blade having the function of a diaphragm blade.

As a patent of a prior art pertinent to the present invention, the inventor can indicates as existence of, for example, U.S. Pat. No. 4,609,275.

The U.S. Pat. No. 4,609,275 discloses an exposure control unit for a programming shutter which employs an electrostrictive element having a fixed end and a free end which is deformed when a voltage is applied to the element and the deformation of the element is used to open shutter blades having the function of the diaphragm. A voltage increasing with the lapse of time in interlocked relationship with the opening operation of the shutter blades is applied to the electrostrictive element so that the element is gradually deformed and the shutter blades are also gradually opened. The electrostrictive element is then short-circuited at a time when a proper exposure is obtained so that the exposure operation is immediately terminated.

The electrostrictive element operates in the same manner as a capacitor in a circuit. Once electric charges are stored in the electrostrictive element, the element maintains its deformation condition by the stored charges even after removal of an applied voltage. The element is restored to its initial state by discharge of the stored charges. When the electrostrictive element is employed as a driving source for mechanical members, and more particularly when the element is used as a driving source of a mechanism requiring exact positioning accuracy, the element exhibits an undesirable characteristic due to existence of hysteresis characteristic thereof. That is, even if the voltage across electrodes of the element is the same, the deformation quantity of the element in the case of the stored condition of charges thereto is different from that in the case of the discharged condition.

Accordingly, when the electrostrictive element is used as the driving source for the mechanical members and more particularly when the element is continuously operated, the initial deformation of the element is different depending on operation intervals of the element and the deformation quantity obtained is not constant even if a desired voltage is applied to the element. When the element is applied to, for example, a driving mechanism of the shutter blade, an opened position of the shutter blade is not constant even if a desired voltage is applied to the element and hence correct exposure control can not be attained. Such a problem that the deformation quantity obtained finally is not constant due to the magnitude of the initial deformation quantity even if a driving voltage is the same occurs in common in the case where the electrostrictive element is used as the driving source to position the mechanical members as well as in the case where the element is used as the driving source of the shutter blade.

SUMMARY OF THE INVENTION

Accordingly, it is an object of the present invention to provide a novel driving unit using an electrostrictive element in which a desired deformation characteristic can be always obtained regardless of the magnitude of an initial deformation quantity of the element caused by hysteresis of the element.

More particularly, the driving unit according to the present invention including the electrostrictive element which is deformed by application of a voltage, a voltage control circuit which applies a voltage to the element, and a mechanical member coupled with the element and positioned by deformation produced in the element in accordance with the voltage applied to the element from the voltage control circuit, comprises a reference switch which operates when a reference deformation quantity is obtained in an area where a ratio of a variation quantity of the applied voltage to the element and a variation quantity of the deformation quantity of the element is a fixed value and furthermore the voltage control circuit establishes a voltage applied to the element at a time when the reference switch is operated as a reference voltage and adds a voltage corresponding to a difference between a desired deformation quantity of the element and the reference deformation quantity to the reference voltage to apply the added voltage to the element so that the above object is achieved.

Accordingly, according to the present invention, since the voltage applied to the electrostrictive element when the reference switch detects that the deformation quantity of the element reaches the reference deformation quantity is established as the reference voltage to which the voltage corresponding to the difference between the desired deformation quantity and the reference deformation quantity is applied, a desired deformation characteristic can be obtained regardless of the magnitude of the initial deformation quantity.

Further, a shutter blade having the function of the diaphragm blade is employed as the mechanical member. The voltage control circuit comprises first circuit means which produces a voltage increasing linearly in proportion to the lapse of time and timer means for determining a timing that operation of the first circuit means is stopped. Thus, when an output voltage of the first circuit means is applied to the element and the timer means is started at the timing when the reference switch is operated, a period of time until the timer means is operated after the switch has been operated is determined uniquely regardless of the magnitude of the initial deformation quantity and accordingly an F value and an effective exposure time obtained finally can be made constant.

DETAILED DESCRIPTION OF THE PREFERRED EMBODIMENTS

An embodiment of the present invention is now described with reference to drawings.

Figure 1:
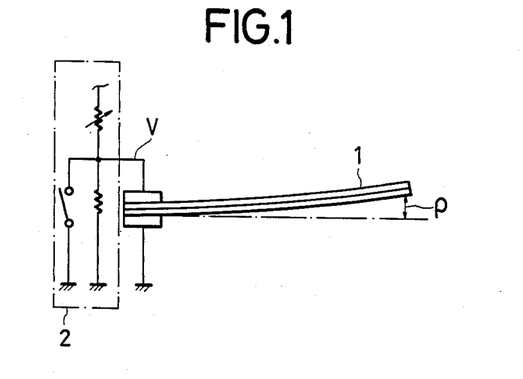
FIG. 1 illustrates the principle of a driving unit using an electrostrictive element.

Referring to FIG. 1 illustrating the principle of the driving unit using the electrostrictive element of the present invention, the electrostrictive element 1 of a bimorph structure includes a fixed end thereof to which a power supply circuit 2 is connected.

When a voltage V is applied to the element 1 from the power supply circuit 2, free end of the element is deformed and the deformation quantity $\rho$ of the element at the free end is determined in accordance with the applied voltage V.

Figure 2:
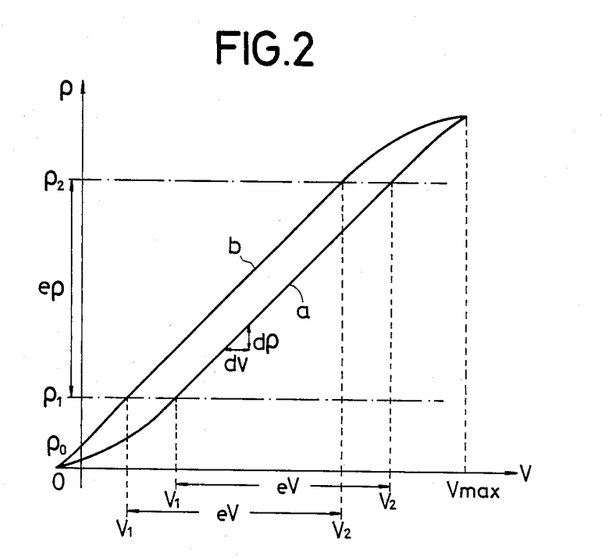
FIG. 2 is a characteristic diagram showing a relation of an applied voltage to the electrostrictive element and a deformation quantity thereof.

Referring to FIG. 2 showing a characteristic diagram of a relation between the applied voltage V to the element 1 and the deformation quantity $\rho$ of the element, when the applied voltage V is increased from 0 volt to a maximum allowable voltage $V_{max}$, the element 1 is deformed along a curve a of FIG. 2, while when the applied voltage V is reduced from the maximum allowable voltage $V_{max}$ to 0 volt, the deformation of the element 1 is restored along a curve b of FIG. 2.

While the deformation characteristic of the electrostrictive element 1 possesses the hysteresis characteristic as shown in FIG. 2, the characteristic possesses an area in which the curves a and b of FIG. 2 are substantially parallel to each other (that is, in which a variation quantity $d\rho$ of the deformation quantity $\rho$ in respect to a variation quantity $dV$ of the applied voltage V is generally constant, and this area is named a linear area in the present invention), and an applied voltage to the electrostrictive element 1 is controlled in this linear area in the present invention.

When a voltage is applied to the electrostrictive element 1 to obtain a desired deformation quantity $\rho_2$, the voltage $V_2$ applied to the element is not constant due to influence of the initial deformation quantity $\rho_0$ caused by the hysteresis of the element. However, it is apparent from FIG. 2 that when a constant addition voltage eV is applied to or superposed on the electrostrictive element 1 which has already applied with a reference voltage $V_1$ (that is not also constant due to the initial deformation quantity $\rho_0$) in the linear area and has already deformed with a constant reference deformation quantity $\rho_1$, the deformation quantity $\rho_2$ of the element 1 obtained finally is a constant value since the addition deformation quantity $e\rho$ of the element 1 is proportional to the addition voltage eV.

Accordingly, the present invention comprises a reference switch which operates when a deformation quantity of the electrostrictive element 1 reaches the constant reference deformation quantity $\rho_1$. Thus, a voltage which has already applied to the element 1 at the time when the switch is operated is set to the reference voltage $V_1$ and the addition voltgage eV is superposed on the reference voltage $V_1$ so that the element 1 is further deformed by the addition deformation quantity $e\rho$ to obtain the desired deformation quantity $\rho_2$.

Figure 3:
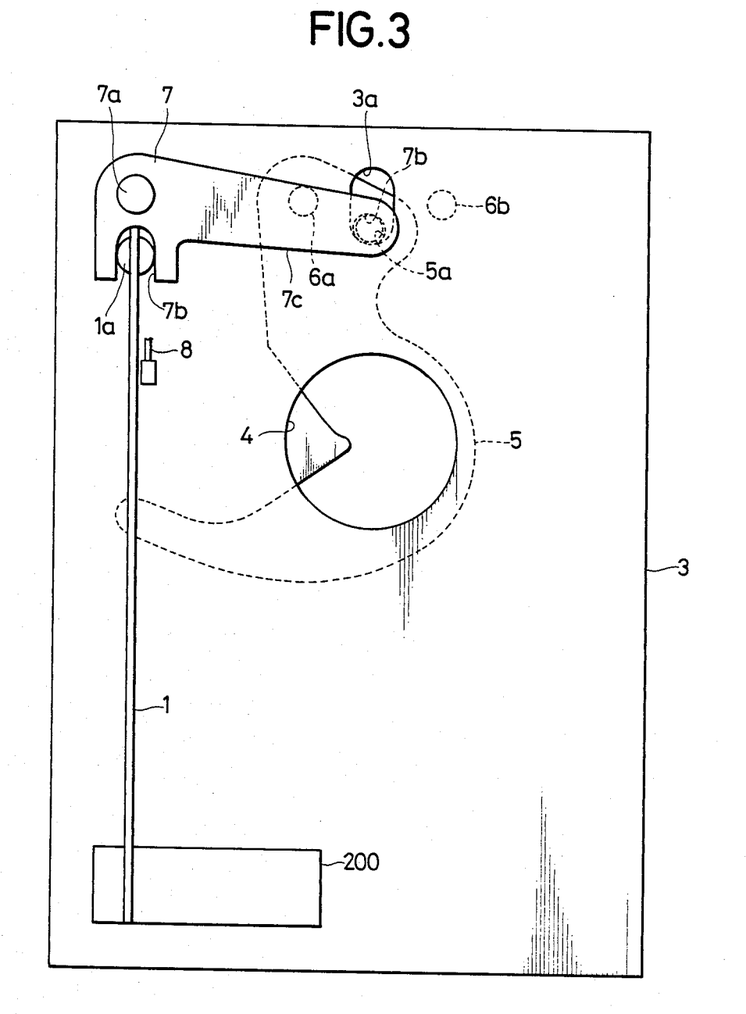
FIG. 3 illustrates an exemplified shutter mechanism to which the present invention is applied.

FIG. 3 shows a mechanism of a programming shutter using a shutter blade having the function of a diaphragm blade which is an example of a mechanism driven by the driving unit using the electrostrictive element of the present invention.

In FIG. 3, the electrostrictive element 1 described above includes an end which is fixed to a base plate 3 for the shutter through a stationary member 200.

The base plate 3 is formed with an aperture 4. A shutter blade 5 having the function of the diaphragm is swingably supported on the rear side of the base plate 3 by an axis 6a.

FIG. 3 shows only one shutter blade in order to avoid complexity of the drawing, while the other shutter blade not shown is supported on the rear side of the base plate 3 by an axis 6b in the same manner and in the bilateral symmetry.

There is provided a coupling lever 7 for transmitting deformation produced at the free end of the electrostrictive element 1.

The coupling lever 7 is swingably supported to the base plate 3 by an axis 7a. The coupling lever 7 is formed with a groove 7b in which a contact member 1a fixed to the free end of the element 1 is supported.

The lever 7 includes an operating arm 7c and a boss 7d is formed on the rear side of the arm 7c. The boss 7d penetrates an elongated hole 3a formed in the base plate 3 and is engaged in an elongated hole 5a formed in the shutter blade 5.

The shutter blade 5 closes the aperture 4 in the condition where the element 1 is not deformed as shown in FIG. 3, while when the free end of the element 1 is deformed right in FIG. 3, the lever 7 is rotated counterclockwise and the boss 7d at the end of the arm 7c pushes up the elongated hole 5a of the shutter blade 5. Accordingly, the shutter blade is rotated counterclockwise about the axis 6a and the aperture 4 is opened. The opening area of the aperture 4 at this time is determined in accordance with the deformation quantity of the element 1. Accordingly, in order to control the proper exposure using the programming shutter of this type, it is required to control exactly the deformation quantity of the element 1 with the lapse of time.

Numeral 8 denotes a reference switch which is a feature of the present invention, and the switch 8 is adapted to be broken or opened when the deformation quantity of the element 1 reaches the reference deformation quantity $\rho_1$.

In the present embodiment, in the case where an applied voltage to the element 1 is increased with the lapse of time, the addition voltage eV increasing with the lapse of time is superposed on the reference voltage $V_1$ applied to the element 1 when the deformation quantity of the element 1 reaches the reference deformation quantity $\rho_1$ and the switch 8 is opened so that the element 1 is further deformed by the addition deformation quantity $e\rho$ to obtain the desired opening characteristic.

Figure 4:
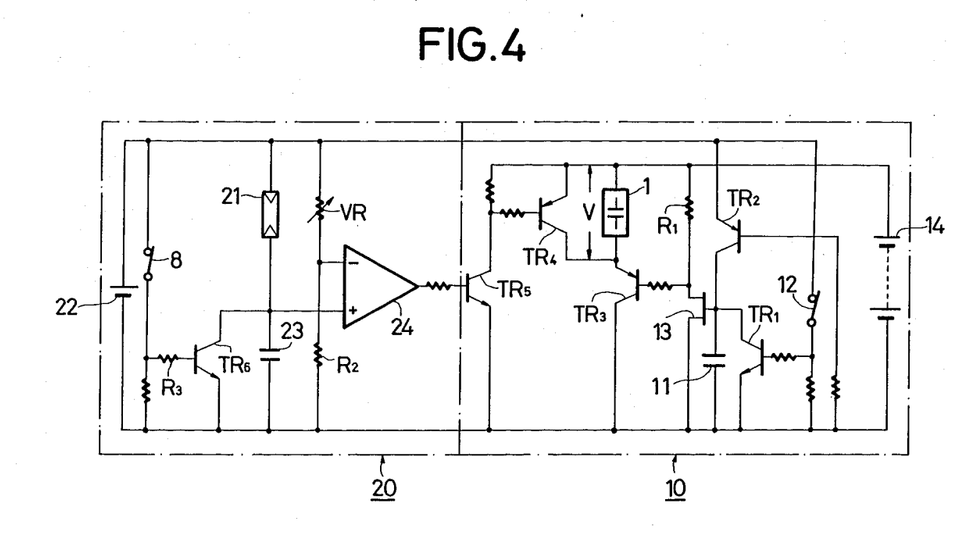
FIG. 4 is a circuit diagram showing an embodiment of the present invention.

FIG. 4 shows an example of a circuit for controlling the applied voltgage to the element as described above, in which the electrostrictive element 1 operates in the same manner as a capacitor in a circuit.

In FIG. 4, numeral 10 denotes a driving circuit, and numeral 20 denotes an exposure control circuit including timer means.

The driving circuit 10 of FIG. 4 is adapted to apply a voltage increasing substantially linearly with the lapse of time to the element 1 in order to increase the opening of the shutter blade having the function of the diaphragm substantially linearly.

More particularly, in FIG. 4, there is provided a parallel circuit of a capacitor 11 and a transistor $TR_1$ to which a constant current is supplied through a transistor $TR_2$ forming a constant current source. The transistor $TR_1$ is switched on and off by a shutter release switch 12 (break contact) connected to a base electrode thereof and when the transistor $TR_1$ is turned off, the capacitor 11 begins to be charged.

An FET 13 and a resistor $R_1$ are connected in series to a high voltage source 14. A drain current flowing through the series circuit is controlled by a charged level of the capacitor 11 applied to a gate of the FET 13. A voltage produced across the resistor $R_1$ by the drain current flowing through the resistor $R_1$ is applied to the electrostrictive element 1 through a transistor $TR_3$. The FET 13 and the resistor $R_1$ forms a voltage amplifier circuit.

A switching transistor $TR_4$ is connected in parallel with the element 1 so that the transistor $TR_4$ short-circuits the element 1. An operation timing of the transistor $TR_4$ is controlled by the exposure control circuit 20 described in detail below.

The exposure control circuit 20 comprises an integrating circuit for integrating brightness of a subject to be photographed and which includes a CdS (cadmium sulfide) 21 which is an example of a photometric element and a capacitor 23 connected in series to a power source 22 through the CdS 21. The capacitor 23 is charged by a photocurrent flowing through the CdS 21 in accordance with the brightness of the subject and accordingly the charged level of the capacitor 23 indicates an integrated value of light from the subject to be photographed.

A comparator 24 includes an inverted input level which is determined by a division ratio of a variable resistor VR which is operated in interlocked relationship with, for example, a film speed setting mechanism and a resistor $R_2$ and a non-inverted input level which is determined by the charged level of the capacitor 23.

When the charged level of the capacitor 23 reaches the division level of the variable resistor VR and the resistor $R_2$, an output of the comparator 24 is inverted to a high level so that the switching transistors $TR_5$ and $TR_4$ are operated to short-circuit the electrostrictive element 1.

A switching transistor $TR_6$ connected in parallel to the capacitor 23 serves to start the integration of light from the subject by the capacitor 23.

A base of the transistor $TR_6$ is connected to a ground side of the reference switch 8 (break contact) through the resistor $R_3$, as a feature point of the present embodiment. Thus, after the transistor $TR_6$ is turned off by break or opening of the switch 8, the capacitor 23 can be charged.

As described above, since the reference switch 8 is adapted to be broken or opened when the deformation quantity of the electrostrictive element 1 reaches the reference deformation quantity $\rho_1$, the capacitor 23 starts the integration of light from the subject to be photographed when the deformation quantity of the element 1 reaches the reference deformation quantity $\rho_1$.

Operation of the present embodiment is now described with reference to the above description.

First of all, in the initial state, the reference switch 8 is closed and the switching transistor $TR_6$ is conductive. Accordingly, the capacitor 23 does not start the integration.

Accordingly, the output of the comparator 24 is low level and the transistor $TR_5$ is off. The base of the transistor $TR_4$ is a high level. Accordingly, the transistor $TR_4$ is off and the electostrictive element 1 can be charged.

Further, the deformation quantity of the element 1 at this time, that is, the initial deformation quantity $\rho_0$ is not constant due to the hysteresis of the element.

In this state, when the shutter release switch 12 is broken or opened in interlocked relationship with operation of the shutter button not shown, the base input of the switching transistor $TR_1$ is low level and the transistor $TR_1$ is turned off. Thus, the capacitor 11 is charged by the constant current flowing through the transistor $TR_2$ and the charged level thereof is increased substantially linearly.

When the capacitor 11 is charged in this manner, the gate level of the FET 13 is also increased and the drain current of the FET 13 is also increased.

A voltage V corresponding to a voltage produced across the resistor $R_1$ in accordance with the drain current of the FET 13 is applied to the electrostrictive element 1 through the transistor $TR_3$. The free end of the element 1 is deformed right in FIG. 3 in response to the applied voltage V and the deformation quantity $\rho$ of the element 1 is increased with the charge of the capacitor 11.

In this manner, when the free end of the element 1 is deformed right in FIG. 3, the coupling lever 7 is rotated through the contact member 1a counterclockwise and the boss 7d at the end of the lever 7 rotates the shutter blade 5 counterclockwise while the boss 7d is engaged in the elongated hole 5a of the shutter blade 5 so that the aperture 4 is opened.

As described above, in the case where the aperture 4 starts its opening operation, the deformation quantity of the element 1 reaches the reference deformation quantity $\rho_1$ before the shutter blade 5 forms a pinhole and the reference switch 8 is opened at this time.

When the switch 8 is opened, the base of the transistor $TR_6$ is ground level and the transistor $TR_6$ is turned off so that the capacitor 23 for the integration can be charged.

It is a matter of course that the reference voltage $V_1$ applied to the element 1 at the time when the deformation quantity of the element 1 reaches the reference deformation quantity $\rho_1$ is different depending on the initial deformation quantity of the element 1 due to the influence of the hysteresis. The larger the initial deformation quantity of the element 1 is, the lower the reference voltage $V_1$ applied to the element 1 at the time when the deformation quantity of the element 1 reaches the reference quantity $\rho_1$ is.

A photocurrent corresponding to the brightness of the subject begins to flow through the CdS 21 as the aperture 4 is opened and the capacitor 23 is charged by the photocurrent flowing through the CdS 21.

When the charged level of the capacitor 23 exceeds the level determined by the division ratio of the variable resistor VR and the resistor $R_2$, the output of the comparator 24 is inverted to high level.

The time required until the output of the comparator 24 is inverted is determined in accordance with the brightness of the subject to be photographed and the film speed, and when the brightness and the film speed are constant, the output of the comparator 24 is inverted after a fixed period from the break or opening of the reference switch 3.

When the output of the comparator 24 is inverted to high level, the transistors $TR_5$ and $TR_4$ are turned on. Accordingly, the element 1 is short-circuited through the transistor $TR_4$ and the stored charges to the element 1 is discharged so that the element 1 is restored from the deformed state to the initial state thereof.

When the element 1 is restored to its initial state, the lever 7 is rotated clockwise through the contact member 1a and the boss 7d at the end of the lever rotates the shutter blade 5 clockwise while the boss is engaged in the elongated hole 5a of the shutter blade 5, so that the aperture 4 is closed.

As described above, the time until the output of the comparator 24 is inverted after the reference switch 8 has been operated is uniquely determined by the brightness and the film speed.

Further, since the capacitor 11 determining the applied voltage to the element 1 is charged by the constant current, the variation of the applied voltage to the element 1 during the time until the output of the comparator 24 is inverted after the switch 8 has been operated, that is, the addition voltage eV is uniquely determined in accordance with the brightness and the film speed.

Since the variation dρ of the deformation quantity of the element 1 is proportional to the variation dV of the applied voltage in the linear area, the addition deformation quantity eρ corresponding to the addition voltage eV is also uniquely determined in accordance with the brightness and the film speed.

Accordingly, in the present invention, the final deformation quantity $\rho_2$ of the element 1 is always uniquely determined in accordance with the brightness and the film speed regardless of the magnitude of the initial deformation quantity $\rho_0$ of the element 1.

Figure 5:
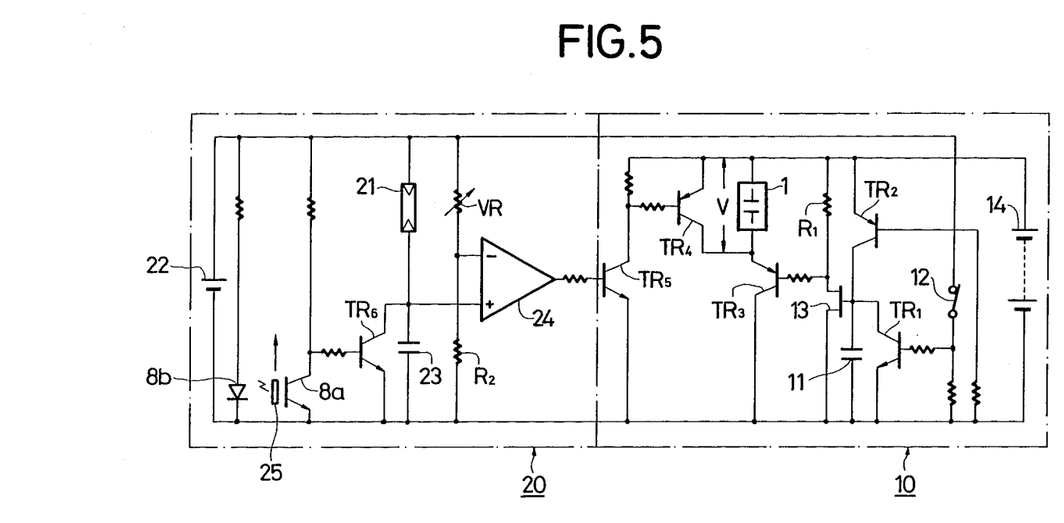
FIG. 5 is a circuit diagram showing another embodiment of the present invention.

FIG. 5 is a circuit diagram showing a modification of the present invention.

More particularly, it is assumed that the embodiment of FIG. 4 employs a mechanical contact as an example of the reference switch 8, while the embodiment of FIG. 5 employs a photointerrupter including a phototransistor 8a and a light emitting diode 8b.

In FIG. 5, numeral 25 denotes a light interrupting member for opening and closing a light path from the light emitting diode 8b to the phototransistor 8a in interlocked relationship with the deformation operation of the element 1. The member 25 is formed of a part of the free end of the element 1, the shutter blade 5 or the coupling lever 7.

The light interrupting member 25 is formed to close the light path from the light emitting diode 8b to the phototransistor 8a in the initial state thereof and open the light path when the deformation quantity of the element 1 reaches the reference deformation quantity $\rho_1$.

The embodiment of FIG. 5 is formed in the same manner as the embodiment of FIG. 4 except the reference switch 8. When the light path from the light emitting diode 8b to the phototransistor 8a is formed and the phototransistor 8a is conductive after the deformation of the element 1 reaches the reference deformation quantity $\rho_1$, the transistor $TR_6$ is turned off and the integration of light from the subject to be photographed is started by the capacitor 23.

Figure 6:
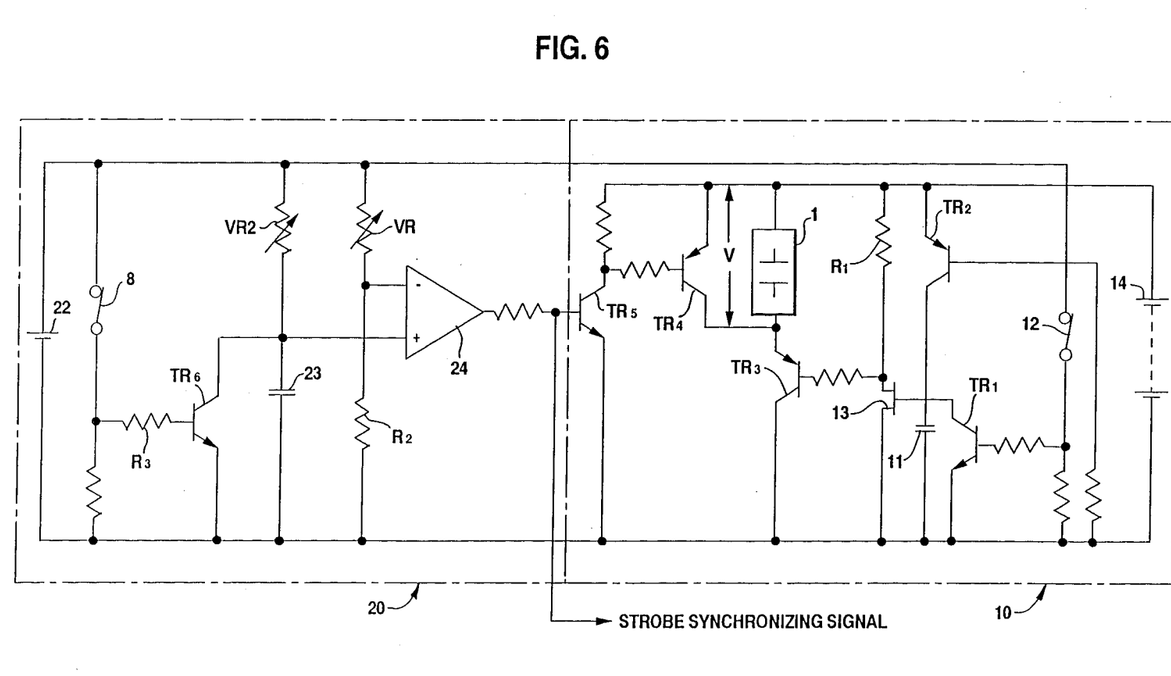
FIG. 6 is a circuit diagram showing a modification of the embodiment shown in FIG. 4.
Figure 7:
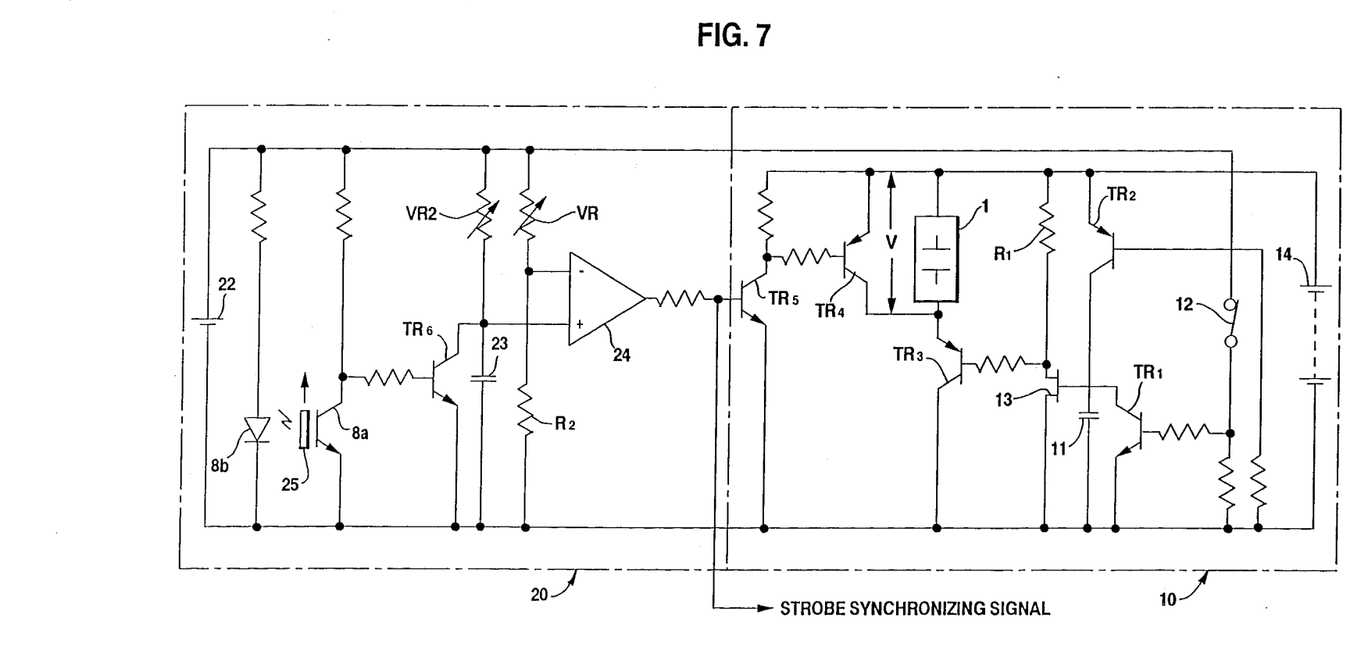
FIG. 7 is a circuit diagram showing a modification of the embodiment shown in FIG. 5.

While, in the above embodiments, the capacitor 23 is charged by the current corresponding to the brightness, a strobe synchronizing timing in a so-called automatic flashlight photographing operation can be determined by the provision of a strobe synchronizing circuit as shown in FIG. 6 and FIG. 7, in which the CdS 21 of the exposure control circuit 20 is replaced with a variable resistor $VR_2$ varied in interlocked relationship with the photographing distance.

In the embodiments, the end of the electrostrictive element is fixed and the free end thereof drives the mechanical member, while both the end of the element may be fixed to drive the mechanical member by the middle portion of the element.

The element drives the shutter blade having the function of the diaphragm in the embodiments, while it is a matter of course that the member to be driven is not limited thereto.

While, in the embodiments, the applied voltage to the element is increased in proportion to the elapsed time and the applied voltage is increased during the time corresponding to the brightness after the deformation quantity of the element reaches the reference deformation quantity, the essential point of the present invention resides in that the voltage (that is, addition voltage) corresponding to the difference between the reference deformation quantity and the desired deformation quantity (that is, addition deformation quantity) is superposed on the voltage (that is, reference voltage) applied to the element at the time when the reference deformation is obtained.

Accordingly, the voltage applied to the element when the reference switch is operated is detected as a reference voltage and the addition voltage corresponding to the difference between the desired deformation quantity and the reference deformation quantity may be added to the reference voltage to apply it to the electrostrictive element.

As described above, according to the present invention, since the electrostrictive element is driven in the area where the ratio of the variation of the applied voltage and the variation of the deformation quantity is substantially constant and the voltage applied to the element at the time when the deformation quantity of the element reaches the reference deformation quantity is set as the reference voltage on which the voltage corresponding to the difference between the desired deformation quantity and the reference deformation quantity is superposed to be applied to the element, the desired deformation quantity can be always obtained regardless of the magnitude of the initial deformation quantity of the element due to the hysteresis of the element.

Further, in the case where the shutter blade having the function of the diaphragm is employed as an example of the mechanical member driven by the electrostrictive element and the voltage applied to the element is increased with the lapse of time while timer means for exposure control is started at the timing when the deformation of the element reaches the reference deformation quantity, since the time until the timer means is operated after the reference switch has been operated is uniquely determined regardless of the magnitude of the initial deformation quantity, the F value and the effective exposure time obtained finally can be made constant.

What is claimed is:

1. A driving unit including an electrostrictive element which is deformed in response to application of a voltage, a voltage control circuit for applying the voltage to said element and a mechanical member coupled with said element and positioned by deformation produced in said element in response to the applied voltage to said element from said voltage control circuit, comprising:

a reference switch which is operated when a reference deformation quantity of said element in an area in which a ratio of variation of the applied voltage to said element and variation of a deformation quantity of said element is substantially constant is obtained;

said voltage control circuit establishing a voltage applied to said element when said reference switch is operated as a reference voltage to which a voltage corresponding to a difference between a desired deformation quantity and the reference deformation quantity is added to be applied to said element.

2. A driving unit according to claim 1, wherein said mechanical member comprises a shutter blade having function of a diaphragm blade, and said voltage control circuit comprises first circuit means for producing a voltage increasing linearly in proportion to passage of time and timer means for determining a timing that operation of said first circuit means is stopped, an output voltage of said first circuit means being applied to said electrostrictive element, the timer means being started when said reference switch is operated.

3. A driving unit according to claim 2, wherein said timer means determines a time until the operation of said first circuit means is stopped after said reference switch has been operated in accordance with a film speed and brightness of a subject to be photographed.

4. A driving unit according to claim 2, wherein said timer means determines a time until the operation of said first circuit means is stopped after said reference switch has been operated in accordance with a film speed and a photographing distance.

5. A driving unit according to claim 1, wherein said reference switch comprises a photointerrupter which is operated when the deformation quantity of said electrostrictive element reaches the reference deformation quantity.

6. A driving unit according to claim 2, wherein said reference switch comprises a photointerrupter which is operated when the deformation quantity of said electrostrictive element reaches the reference deformation quantity.

7. A driving unit according to claim 3, wherein said reference switch comprises a photointerrupter which is operated when the deformation quantity of said electrostrictive element reaches the reference deformation quantity.

8. A driving unit according to claim 4, wherein said reference switch comprises a photointerrupter which is operated when the deformation quantity of said electrostrictive element reaches the reference deformation quantity.

9. A driving unit including an electrostrictive element which is deformed in response to application of a voltage, a voltage control circuit for applying the voltage to said element and a mechanical member coupled with said element and positioned by deformation produced in said element in response to the applied voltage to said element from said voltage control circuit, comprising:

a detecting means for detecting that the amount of deformation of said element has reached a reference deformation amount; and a reference switch which is operated in response to detection by said detecting means that the amount of deformation has reached said reference amount;

said voltage control circuit establishing a voltage applied to said element when said reference switch is operated as a reference voltage to which a voltage corresponding to a difference between a desired amount of deformation and said reference deformation amount is added to be applied to said element.

10. A driving unit according to claim 9, wherein said mechanical member comprises a shutter blade having function of a diaphragm blade, and said voltage control ciruit comprises first circuit means for producing a voltage increasing linearly in proportion to passage of time and timer means for determining a timing that operation of said first circuit means is stopped, an output voltage of said first circuit means being applied to said electrostrictive element, the timer means being started when said reference switch is operated.

11. A driving unit according to claim 10, wherein said timer means determines a time until the operation of said first circuit means is stopped after said reference switch has been operated in accordance with a film speed and brightness of a subject to be photographed.

12. A driving unit according to claim 10, wherein said timer means determines a time until the operation of said first circuit means is stopped said reference switch has been operated in accordance with a film speed and a photographing distance.

13. A driving unit according to claim 9, wherein said reference switch comprises a photointerrupter which is operated when the deformation quantity of said electrostrictive element reaches the refrence deformation quantity.

14. A driving unit according to claim 10, wherein said reference switch comprises a photointerrupter which is operated when the deformation quantity of said electrostrictive element reaches the reference deformation quantity.

15. A driving unit according to claim 11, wherein said reference switch comprises a photointerrupter which is operated when the deformation quantity of said electostrictive element reaches the reference deformation quantity.

16. A driving unit according to claim 12, wherein said reference switch comprises a photointerrupter which is operated when the deformation quantity of said electrostrictive element reaches the reference deformation quantity.

* * * * *